United States Patent
Weng et al.

(10) Patent No.: US 7,442,580 B2
(45) Date of Patent: Oct. 28, 2008

(54) MANUFACTURING METHOD OF A PACKAGE STRUCTURE

(75) Inventors: Gwo-Liang Weng, Kaohsiung (TW); Cheng-Yin Lee, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 133 days.

(21) Appl. No.: 11/637,786

(22) Filed: Dec. 13, 2006

(65) Prior Publication Data

US 2007/0224732 A1    Sep. 27, 2007

(30) Foreign Application Priority Data

Mar. 24, 2006  (TW)  .............................. 95110423 A

(51) Int. Cl.
*H01L 21/00* (2006.01)

(52) U.S. Cl. ........................ 438/113; 438/114; 438/462

(58) Field of Classification Search ......... 438/113–114, 438/462
See application file for complete search history.

(56) References Cited

U.S. PATENT DOCUMENTS

| | | | | |
|---|---|---|---|---|
| 5,989,982 | A * | 11/1999 | Yoshikazu | 438/462 |
| 6,074,896 | A * | 6/2000 | Dando | 438/114 |
| 6,281,047 | B1 * | 8/2001 | Wu et al. | 438/113 |
| 6,737,300 | B2 * | 5/2004 | Ding et al. | 438/110 |
| 6,849,523 | B2 * | 2/2005 | Chao et al. | 438/460 |
| 7,091,109 | B2 * | 8/2006 | Fujii et al. | 438/464 |
| 7,241,642 | B2 * | 7/2007 | Hurtado | 438/113 |
| 2002/0098620 | A1 * | 7/2002 | Ding et al. | 438/113 |
| 2007/0117259 | A1 * | 5/2007 | Anderson et al. | 438/106 |
| 2007/0190691 | A1 * | 8/2007 | Humpston et al. | 438/113 |
| 2007/0224732 | A1 * | 9/2007 | Weng et al. | 438/113 |
| 2008/0001241 | A1 * | 1/2008 | Tuckerman et al. | 257/434 |
| 2008/0002460 | A1 * | 1/2008 | Tuckerman et al. | 365/158 |
| 2008/0029879 | A1 * | 2/2008 | Tuckerman et al. | 257/704 |

* cited by examiner

*Primary Examiner*—Laura M Menz
(74) *Attorney, Agent, or Firm*—Birch, Stewart, Kolasch & Birch, LLP

(57) ABSTRACT

A manufacturing method of a package structure is provided. Firstly, a substrate having a surface is provided. Next, a chip is disposed on the surface of the substrate. Then, a packing material layer is formed on the surface of the substrate. Next, a this film is pasted on the packing material layer. Then the substrate and the packing material layer are thoroughly cut along a cutting line around the chip by a first cutting blade but the thin film is not cut thoroughly. Next, the substrate is thoroughly cut along at least a part of the cutting line by a second cutting blade but the packing material layer is not thoroughly cut such that a part of the packing material layer is exposed. The width of the second cutting blade is larger than the width of the first cutting blade.

8 Claims, 6 Drawing Sheets

MANUFACTURING METHOD OF A PACKAGE STRUCTURE

This application claims the benefit of Taiwan application Serial No. 095110423, filed Mar. 24, 2006, the subject matter of which is incorporated herein by reference.

BACKGROUND OF THE INVENTION

1. Field of the Invention

The invention relates in general to a manufacturing method of a package structure, and more particularly to a manufacturing method of a package structure whose packing material layer is projected from a lateral surface of the substrate.

2. Description of the Related Art

The semi-conductor technology has gained a large advance and is now widely applied in various electronic products to bring convenience to people in their everyday life. Wherein after a packaging process is applied to a semi-conductor chip, the semi-conductor chip is protected from being damaged by moisture or collision. Conventional packaging process is elaborated below by accompanied drawings.

Referring to FIG. 1A~1E, a conventional manufacturing process of a package structure is shown. Firstly, as shown in FIG. 1A, a substrate is provided. Next, as shown in FIG. 1B, a chip 120 is disposed on the substrate 110. The chip 120 and the substrate 110 are bonded by a number of bonding wires 150 such that the chip 120 and the substrate 110 are electrically connected. The circuit disposed inside the chip 120 is electrically connected to the external via the substrate 110. Then, as shown in FIG. 1C, a molding compound 130 is formed on the substrate 110 for preventing the chip 120 from being damaged by moisture or collision. Next, as shown in FIG. 1D, the molding compound 130 and the substrate 110 are thoroughly cut by a cutting blade 140. As shown in FIG. 1E, the substrate 110 forms a package structure 100 after having been cut thoroughly.

In the package structure 100 formed according to the conventional manufacturing method, the lateral wall of the molding compound 130 is aligned with the lateral wall of the substrate 110. How to develop a manufacturing method of a package structure capable of reducing manufacturing cost and providing various types of package structures to fit consumers' needs at the same time has become an imminent issue to be resolved.

SUMMARY OF THE INVENTION

It is therefore an object of the invention to provide a manufacturing method of a package structure. The method uses a first cutting blade and a second cutting blade to form a package structure whose packing material layer is projected from a lateral surface of the substrate by using the existing cutting method. Consequently, the expensive mold cost is saved without adding complicated manufacturing process.

The invention achieves the above-identified object by providing a manufacturing method of a package structure. Firstly, a substrate having a surface is provided. Next, a chip is disposed on the surface of the substrate. Then, a packing material layer is formed on the surface of the substrate. Next, a thin film is pasted on the packing material layer. Then, the substrate and the packing material layer are thoroughly cut along a cutting line around the chip by a first cutting blade but the thin film is not cut thoroughly. Next, the substrate is thoroughly cut along at least a part of the cutting line by a second cutting blade but the packing material layer is not cut thoroughly such that a part of the packing material layer is exposed. The width of the second cutting blade is larger than the width of the first cutting blade.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1A:
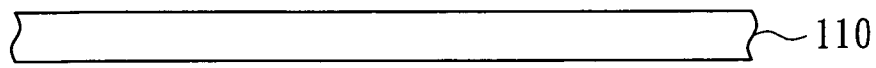
FIG. 1A~1E illustrate a conventional manufacturing process of a package structure.
Figure 1B:
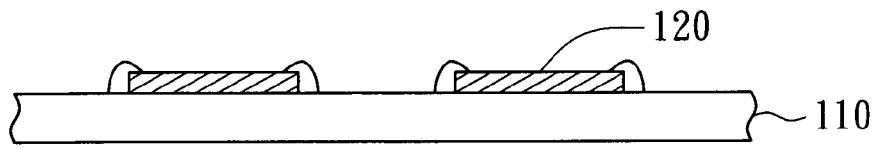
Figure 1C:
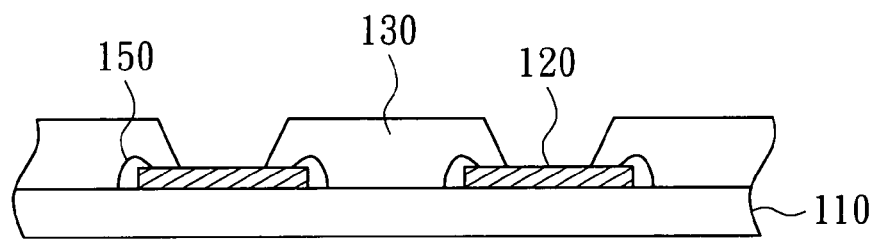
Figure 1D:
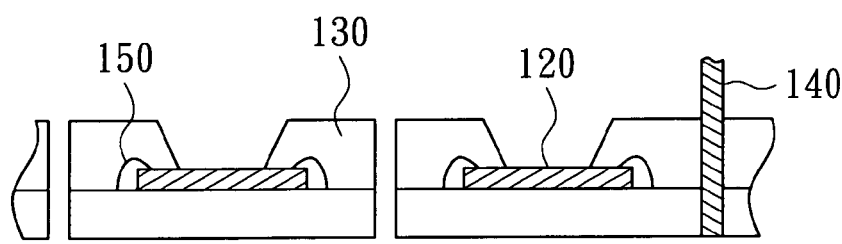
Figure 1E:
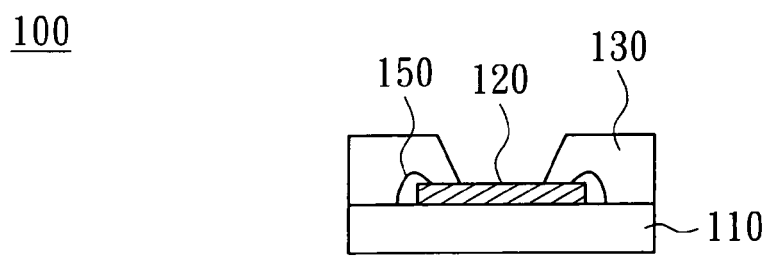
Figure 2:
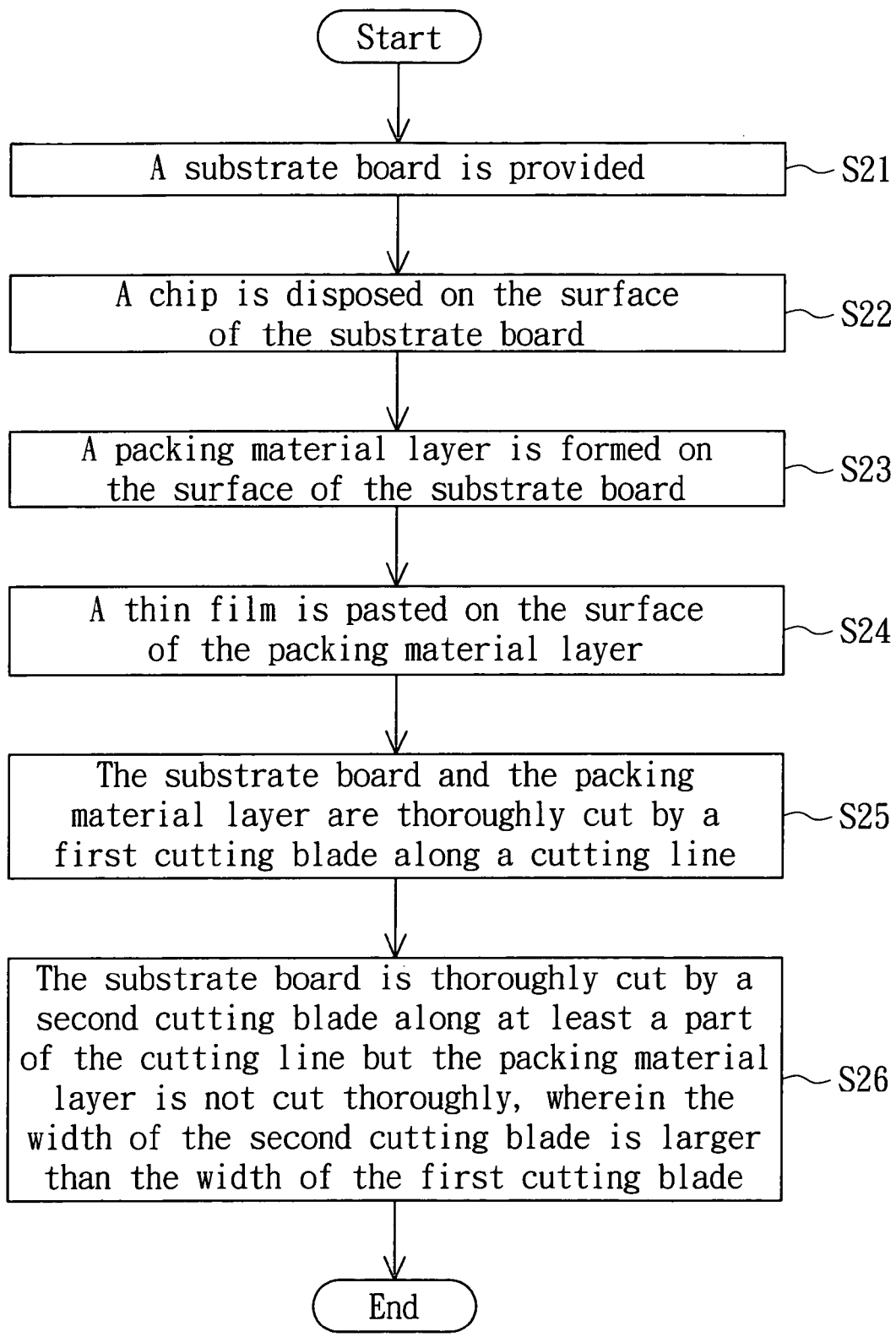
FIG. 2 is a flowchart of a manufacturing method of a package structure according to the invention.
Figure 3A:
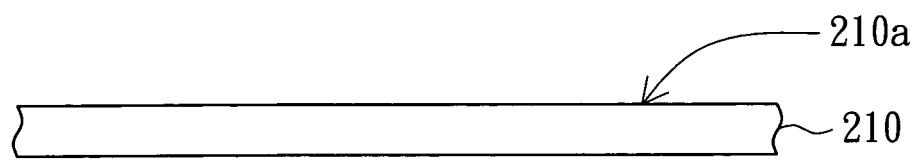
FIG. 3A~3H illustrate the manufacturing process of the package structure according to the invention.

Referring to both FIG. 2 and FIGS. 3A~3H. FIG. 2 is a flowchart of a manufacturing method of a package structure according to the invention. FIGS. 3A~3H illustrate the manufacturing process of the package structure according to the invention. The invention is exemplified by the package structure of a fingerprint recognizer. However, the application of the manufacturing method of the invention is not limited thereto. Firstly, proceed to the step S21 of FIG. 2 as shown in FIG. 3A, a substrate 210 having a surface 210a is provided.

Figure 3B:
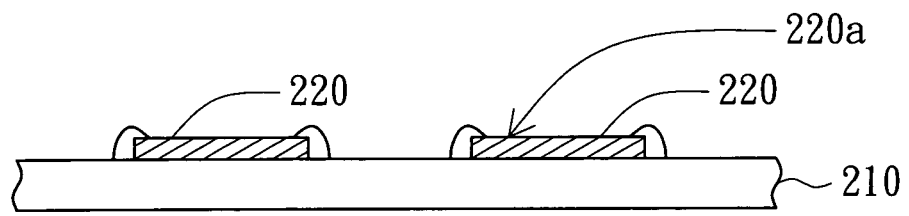

Next, proceed to the step S22 of FIG. 2 as shown in FIG. 3B, a chip 220 is disposed on the surface 210a of the substrate. In the present embodiment of the invention, the chip 220 is a fingerprint recognition chip. The chip 220 has an active surface 220a used for recognizing the fingerprint when touched by a finger. The chip 220 and the substrate 210 are bonded by a wiring bonding process such that the chip 220 and the substrate 210 are electrically connected.

Figure 3C:
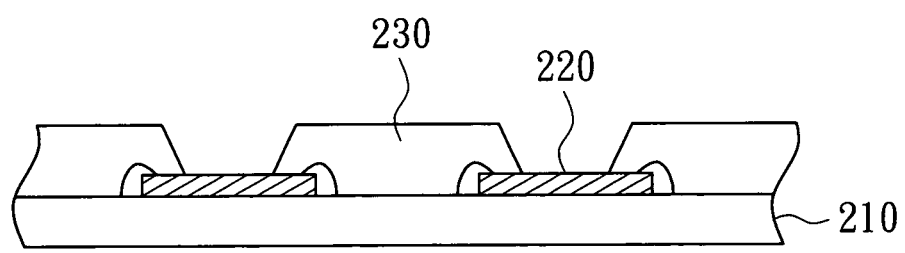

Then, proceed to the step S23 of FIG. 2 as shown in FIG. 3C, a packing material layer 230 is formed on the surface 210a for exposing a part of the active surface 220a such that the active surface 220a can be touched by the finger.

Figure 3D:
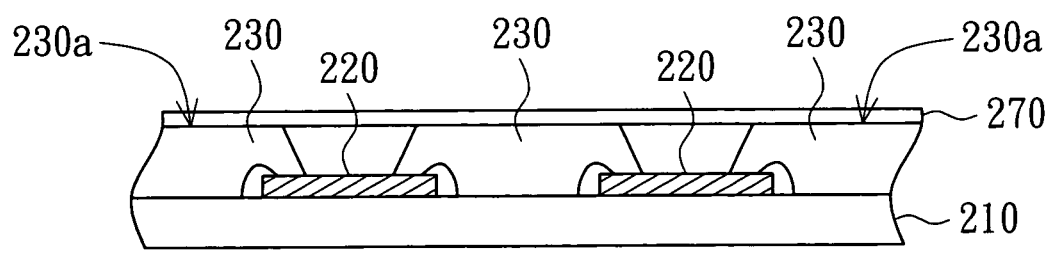

Next, proceed to the step S24 of FIG. 2 as shown in FIG. 3D, a thin film 270 is pasted on the surface 230a of the packing material layer 230.

Figure 3E:
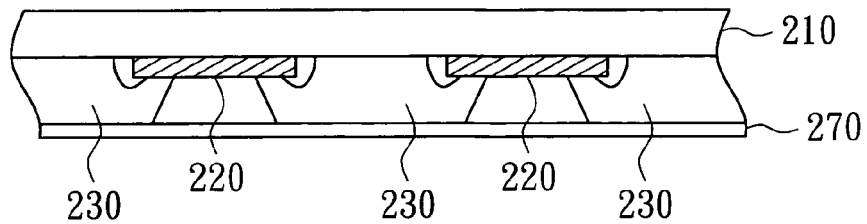

Then, as shown in FIG. 3E, the substrate 210 and the chip 220 are turned over such that the substrate 210, the packing material layer 230 and a thin film 270 are sequentially disposed in a top down order.

Figure 3F:
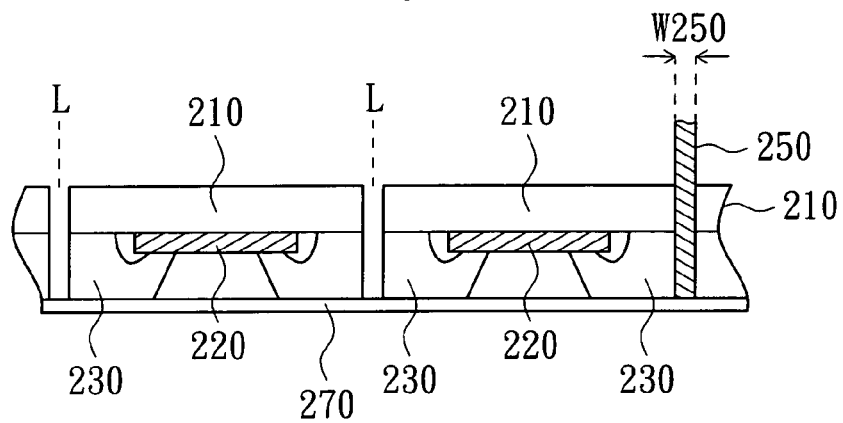
Figure 4:
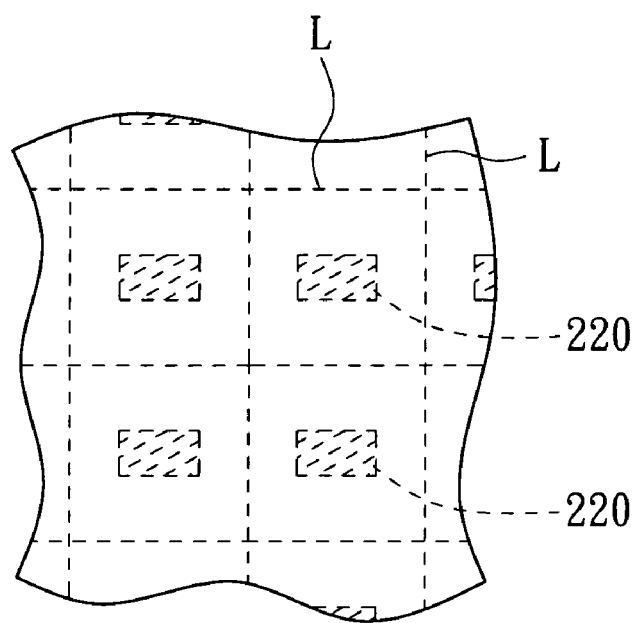
FIG. 4 is a top view of a substrate of FIG. 3F and a cutting line thereof.

Referring to FIG. 4 and FIG. 3F. FIG. 4 is a top view of a substrate of FIG. 3F and a cutting line thereof. A number of chips 220 are disposed under the substrate 210 in a matrix form. The chips 220 are illustrated in dotted lines. Each chip 220 is a rectangular structure, and several alternating cutting lines L surround the chips 220 to form a number of rectangle cutting lines L.

Next, proceed to the step S25 of FIG. 2 as shown in FIG. 3F, the substrate 210 and the packing material layer 230 are thoroughly cut by a first cutting blade 250 along the cutting lines L. The substrate 210 and the packing material layer 230 are thoroughly cut by the first cutting blade 250 but the thin film 270 is not cut thoroughly, such that the substrate 210 and the packing material layer 230 still can be fixed via the thin film 270 after cutting by the first cutting blade 250.

Figure 3G:
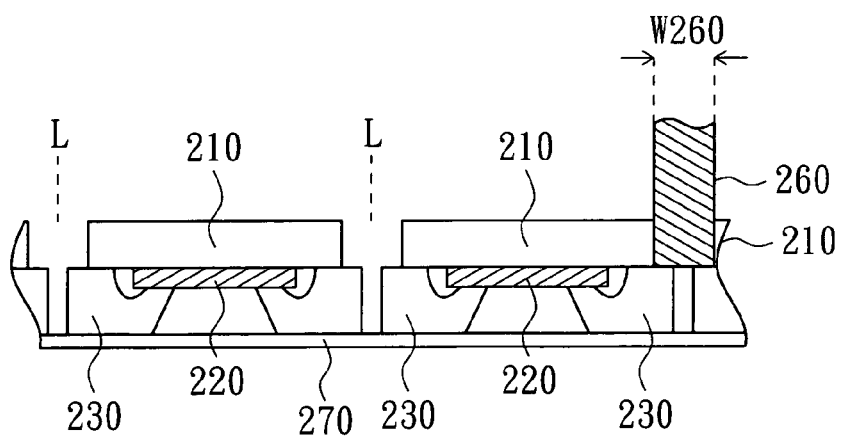

Then, proceed to the step S26 of FIG. 2 as shown in FIG. 3G, the substrate 210 is thoroughly cut by a second cutting blade 260 along at least a part of the cutting lines L but the packing material layer 230 is not cut thoroughly. The width W260 of the second cutting blade 260 is larger than the width W250 of the first cutting blade 250 of FIG. 3F, such that the substrate 210 exposes a part of the packing material layer 230 after cutting by the second cutting blade 260.

Figure 5:
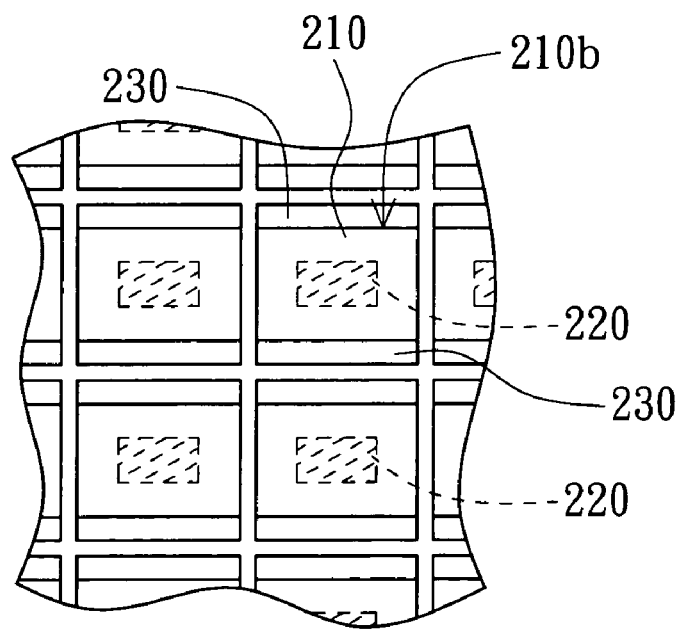
FIG. 5 is a top view of a substrate of FIG. 3G and a cutting line thereof.

Referring to FIG. 5, a top view of a substrate of FIG. 3G and a cutting line thereof is shown. In the step S25 of the present embodiment of the invention, the substrate 210 is thoroughly cut by the second cutting blade 260 along two corresponding lateral sides of the cutting lines L but the packing material layer 230 is not cut thoroughly.

Figure 3H:
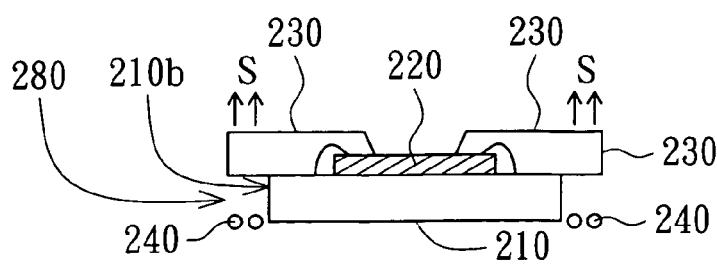

Next, as shown in FIG. 3H, the thin film 270 is removed to form a package structure 200.

Referring to FIG. 3H, after the substrate 210 is thoroughly cut by the second cutting blade 260 but the packing material layer 230 is not cut thoroughly, the lateral surface 210b of the substrate 210 forms a recess 280 with the packing material layer 230. In the present embodiment of the invention, a light source 240 is disposed in the recess 280 for emitting a light S passing through the packing material layer 230 to be projected outside. In the present embodiment of the invention, the packing material layer 230 is made from a transparent material, and the light source 240 is a filament for emitting the light S when electrified.

In the package structure 200 formed according to above manufacturing method, the light source 240 is received in the recess 280 for emitting the light S when electrified. After the fingerprint recognizer of the present embodiment of the invention emits the light S, the user knows whether the fingerprint recognizer is usable.

Second Embodiment

Figure 6:
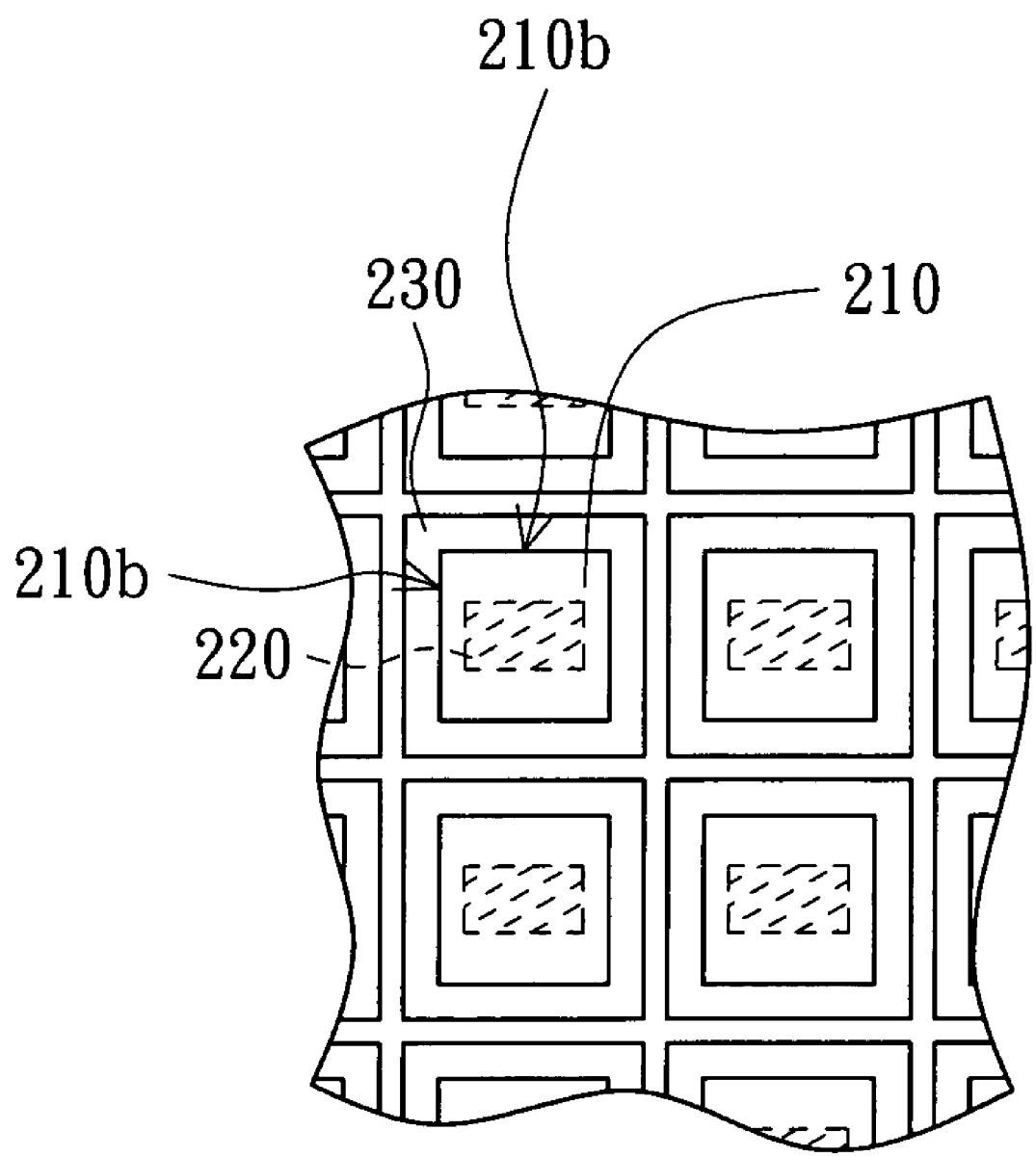
FIG. 6 is a top view of a substrate of a package structure according to a second embodiment of the invention and a cutting line thereof.

Referring to FIG. 6, a top view of a substrate of a package structure according to a second embodiment of the invention and a cutting line thereof is shown. In the present embodiment of the invention, the substrate 210 is thoroughly cut along the four lateral sides of the cutting lines L by the second cutting blade 260 but the packing material layer 230 is not cut thoroughly. Therefore the packing material layer 230 around the chip 220 is projected from a lateral side 210b of the substrate, such that the packing material layer 230 forms a larger recess with the lateral side 210b of the substrate.

In the above two embodiments, despite the manufacturing method of a package structure disclosed in the invention is exemplified by the application in a fingerprint recognizer, however, the manufacturing method of the invention is applicable to various types of package structures. Any package structure formed by using a first cutting blade and a second cutting blade for enabling the packing material layer to be projected from the lateral side of the substrate is within the scope of protection of the invention.

The manufacturing method of package structure disclosed in the above embodiments of the invention forms a package structure by using a first cutting blade and a second cutting blade for enabling the packing material layer to be projected from a lateral surface of the substrate. The manufacturing method has the following advantages:

Firstly, the manufacturing method of the invention enables the packing material layer to be projected from a lateral surface of the substrate by cutting without using extra mold, thus saving molding cost.

Secondly, the manufacturing method of the invention forms the structure of packing material layer by cutting, thus achieving the object of the invention by existing cutting process without using extra complicated manufacturing process and saving manufacturing cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a package structure, the method comprising:
    providing a substrate having a surface;
    disposing a chip on the surface of the substrate;
    forming a packing material layer on the surface of the substrate;
    pasting a thin film on a surface of the packing material layer;
    cutting thoroughly the substrate and the packing material layer along a cutting line around the chip by a first cutting blade without cutting thoroughly the thin film; and
    cutting thoroughly the substrate along at least a part of the cutting line by a second cutting blade without cutting thoroughly the packing material layer for exposing a part of the packing material layer, wherein the width of the second cutting blade is larger than the width of the first cutting blade.

2. The manufacturing method of a package structure according to claim 1, wherein after the step of cutting thoroughly the substrate by the second cutting blade, the method further comprises:
    removing the thin film.

3. The manufacturing method of a package structure according to claim 1, wherein the packing material layer is made from a transparent material.

4. The manufacturing method of a package structure according to claim 1, wherein the package structure is a fingerprint recognizer and the chip is a fingerprint recognition chip.

5. The manufacturing method of a package structure according to claim 1, wherein after the step of disposing the chip, the method further comprises:
    wire bonding the chip and the substrate.

6. The manufacturing method of a package structure according to claim 1, wherein the chip is a rectangular structure and the cutting line is a rectangle.

7. The manufacturing method of a package structure according to claim 6, wherein in the step of cutting thoroughly the substrate by the second cutting blade, the second cutting blade cuts thoroughly the substrate along four lateral sides of the cutting line.

8. The manufacturing method of a package structure according to claim 6, wherein in the step of cutting thoroughly the substrate by the second cutting blade, the second cutting blade cuts thoroughly the substrate along two opposite lateral sides of the cutting line.

* * * * *